(12) United States Patent
Meid et al.

(10) Patent No.: US 10,763,065 B2
(45) Date of Patent: Sep. 1, 2020

(54) METHOD AND DEVICE FOR CONTROLLING AN ELECTROMAGNETIC DRIVE OF A SWITCHING DEVICE

(71) Applicant: EATON INTELLIGENT POWER LIMITED, Dublin (IE)

(72) Inventors: Wolfgang Meid, Muelheim-Kaerlich (DE); Lutz Friedrichsen, Dueren (DE); Ingo Schaar, Bonn (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 215 days.

(21) Appl. No.: 15/774,593

(22) PCT Filed: Nov. 7, 2016

(86) PCT No.: PCT/EP2016/076876
§ 371 (c)(1),
(2) Date: May 9, 2018

(87) PCT Pub. No.: WO2017/080963
PCT Pub. Date: May 18, 2017

(65) Prior Publication Data
US 2018/0330904 A1 Nov. 15, 2018

(30) Foreign Application Priority Data
Nov. 12, 2015 (DE) .................... 10 2015 119 512

(51) Int. Cl.
*H01H 47/32* (2006.01)
*H01H 47/00* (2006.01)
*G01R 31/327* (2006.01)
*H02H 3/24* (2006.01)

(52) U.S. Cl.
CPC ....... *H01H 47/002* (2013.01); *G01R 31/3278* (2013.01); *H01H 47/32* (2013.01); *H02H 3/24* (2013.01); *G01R 31/327* (2013.01); *H01H 47/00* (2013.01)

(58) Field of Classification Search
USPC ............................................ 361/86–87, 160
See application file for complete search history.

(56) References Cited

U.S. PATENT DOCUMENTS 4,812,945 A    3/1989  D Onofrio
4,868,709 A    9/1989  Aoki
5,754,386 A    5/1998  Barbour et al.
(Continued)

FOREIGN PATENT DOCUMENTS

CN    88101201 A    9/1988
CN    1675727 A     9/2005
(Continued)

*Primary Examiner* — Danny Nguyen
(74) *Attorney, Agent, or Firm* — Leydig, Voit & Mayer, Ltd.

(57) ABSTRACT

A method for controlling an electromagnetic drive of a switching device by means of a program, wherein a processor configured by the program executes the following steps: measuring a control voltage applied at an input of the switching device; activating the electromagnetic drive on the basis of the measured control voltage; and setting a rated voltage range on the basis of the measured control voltage.

17 Claims, 6 Drawing Sheets

(56) References Cited

U.S. PATENT DOCUMENTS

| | | | | |
|---|---|---|---|---|
| 6,504,698 B1 * | 1/2003 | Durif | ............... | H01H 47/04 |
| | | | | 361/152 |
| 7,403,366 B2 | 7/2008 | Melchert et al. | | |
| 2001/0035755 A1 * | 11/2001 | Shirato | ............ | H01H 47/325 |
| | | | | 324/418 |
| 2018/0138692 A1 * | 5/2018 | Von Allmen | ......... | H01H 47/325 |

FOREIGN PATENT DOCUMENTS

| | | |
|---|---|---|
| CN | 1832877 A | 9/2006 |
| CN | 101183616 A | 5/2008 |
| CN | 201348976 Y | 11/2009 |
| CN | 204696038 U | 10/2015 |
| WO | WO 2014044317 A1 | 3/2014 |

\* cited by examiner

METHOD AND DEVICE FOR CONTROLLING AN ELECTROMAGNETIC DRIVE OF A SWITCHING DEVICE

CROSS-REFERENCE TO PRIOR APPLICATIONS

This application is a U.S. National Phase application under 35 U.S.C. § 371 of International Application No. PCT/EP2016/076876, filed on Nov. 7, 2016, and claims benefit to German Patent Application No. DE 10 2015 119 512.7, filed on Nov. 12, 2015. The International Application was published in German on May 18, 2017 as WO 2017/080963 under PCT Article 21(2).

FIELD

The invention relates to a method for controlling an electromagnetic drive of a switching device, in particular a contactor, to a corresponding apparatus and to a switching device having an apparatus of this kind.

BACKGROUND

Switching devices, such as contactors, are manufactured having a rated control supply-voltage. Paragraph 7.2.1.2 of the VDE 0660-100 or IEC/EN/D1N EN 60947-1 standards indicates limit values for operating switching devices having a mechanical drive.

For example, it is specified that a contactor must be switched on at between 85% and 110% of its rated control supply-voltage. This applies to both DC and AC voltages. If a range is given for the rated control supply-voltage, 85% refers to the lower voltage value, and 110% refers to the upper voltage value.

An electronically controlled contactor must be released at between 75% and 20% of the rated control supply-voltage for AC voltage or at between 75% and 10% of the rated control supply-voltage for DC voltage, i.e. said contactor may be released at 75%, but must have been released at 20% and 10%, respectively. If a rated control supply-voltage range is given for operating the contactor, 20% or 10% refers to the upper voltage value, and 75% refers to the lower voltage value.

The rated control supply-voltage range (also referred to herein as the rated voltage range for short) must not be too large as mutually exclusive voltage ranges could otherwise overlap, as is intended to be explained with the following example of a contactor and with reference to the voltage ranges of the contactor shown in FIG. 1. At a rated voltage range 100 of from 24 volts to 240 volts (AC or DC voltage), according to the standards the contactor must be switched on in a voltage range 120 of from 85% of 24 volts, i.e. 20.4 volts, to 110% of 240 volts, i.e. 264 volts. According to the standard, the contactor may be released at 75% of 24 volts, i.e. at 18 volts, but must have been released at 20% of 240 volts, i.e. at 48 volts, for AC voltage (voltage range 140).

As can be seen in FIG. 1, the switch-on and switch-off ranges of the contactor overlap in the voltage range 160 of from 20.4 volts to 48 volts, in which range the contactor cannot be switched on.

In order for the limit values specified by the above standards to be observed and for the above-mentioned voltage range overlaps to be avoided, the voltage range of a switching device specified by a rated control supply-voltage must be selected to be relatively small, and manufacturers must provide a rather extensive range of switching devices that are suitable and designed for various rated voltage ranges.

SUMMARY

In an embodiment, the present invention provides a method for controlling an electromagnetic drive of a switching device by means of a program, wherein a processor configured by the program executes the following steps: measuring a control voltage applied at an input of the switching device; activating the electromagnetic drive on the basis of the measured control voltage; and setting a rated voltage range on the basis of the measured control voltage.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
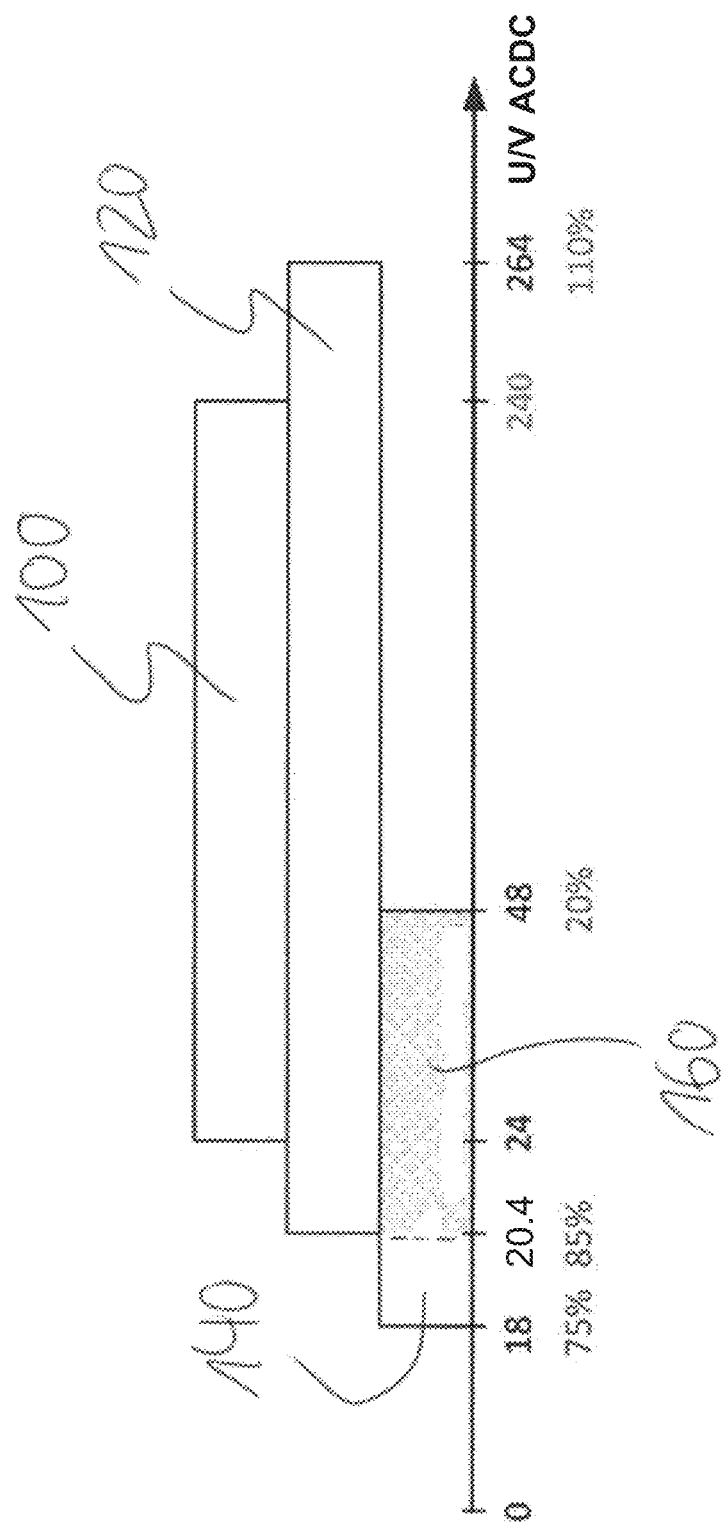
FIG. 1 is a diagram showing voltage ranges of a contactor given by way of example.

One concept underpinning the present invention is that of not only activating an electromagnetic drive of a switching device on the basis of the measurement of a control voltage applied at the input of said switching device, but also setting the rated voltage range of the switching device. In other words, the rated voltage range is therefore accordingly adjusted to the control voltage applied at the input of the switching device such that, in the case of a switching device intended for a large rated voltage range, for example from approximately 24 volts to approximately 240 volts, the switch-on and switch-off ranges are prevented from overlapping when the switching device is used according to the standards.

One embodiment of the invention relates to methods for controlling an electromagnetic drive of a switching device by means of a program, a processor configured by the program executing the following steps: measuring a control voltage applied at the input of the switching device; activating the electromagnetic drive on the basis of the measured control voltage; setting the rated voltage range on the basis of the measured control voltage. The second and third steps do not have to be executed in the indicated sequence, but may also be executed in a different sequence. For example, the step of setting the rated voltage range on the basis of the measured control voltage may be carried out before the step of activating the electromagnetic drive on the basis of the measured control voltage.

In particular, the method may comprise the following steps: initializing the program and declaring a program variable for a lower switch-on voltage threshold, checking whether the measured control voltage exceeds the lower switch-on voltage threshold, and activating the electromagnetic on the basis of the check.

The step of setting of the rated voltage range on the basis of the measured control voltage may comprise the following steps: determining in which of the specified voltage ranges the measured voltage control voltage lies, and adjusting a lower switch-on voltage threshold and an upper switch-off voltage threshold on the basis of the determined specified voltage range.

The step of determining in which of the specified voltage ranges the measured control voltage lies may comprise a plurality of steps to be executed, each of which is intended for one of the specified voltage ranges, and the step of adjusting the lower switch-on voltage threshold and an upper switch-off voltage threshold on the basis of the determined specified voltage range may be carried out following each of the steps to be executed, and the specified voltage ranges may be shifted to higher voltage ranges upon each executed step.

In particular, the specified voltage ranges do not overlap.

For example, the specified voltage ranges may have a first specified AC or DC voltage range of from approximately 24 volts to approximately 48 volts, a second specified AC or DC voltage range of from approximately 48 volts to approximately 110 volts, and a third specified AC or DC voltage range of from approximately 110 volts to approximately 240 volts.

The step of setting the rated voltage range on the basis of the measured control voltage may also comprise calculating a lower switch-on voltage threshold and an upper switch-off voltage threshold on the basis of the measured control voltage. For example, 85% of the measured control voltage may be calculated as a lower switch-on voltage threshold, and 50% of the measured control voltage may be calculated as an upper switch-off voltage threshold. This calculation of a rated voltage range may be carried out in addition or as an alternative to the above-described algorithmic step-by-step determination of a rated voltage range, for example in order to determine a rated voltage range as quickly as possible.

The step of setting the rated voltage range on the basis of the measured control voltage may also comprise reading a rated voltage range from a stored table on the basis of the measured control voltage and setting a lower switch-on voltage threshold and an upper switch-off voltage threshold on the basis of the rated voltage range that has been read. A plurality of rated voltage ranges according to the standards may be stored in the stored table, for example. In this respect, the measured control voltage defines the suitable rated voltage range, which can thus be read from the table on the basis of the measured control voltage and is used for setting the lower switch-on voltage threshold and the upper switch-off voltage threshold.

The step of setting the rated voltage range may also comprise the following steps: checking whether a rated voltage range is preset, and setting the rated voltage range to the preset rated voltage range.

In particular, the rated voltage range may be set to the preset rated voltage range if a preset rated voltage range is available, or if a preset rated voltage range is available and the measured control voltage exceeds and/or falls below one or more specified threshold values.

A preset rated voltage range may be defined, for example, by means of a switch, in particular a DIP switch, a stored value and/or a value received through data communication.

Another embodiment of the invention relates to a computer program comprising program code for carrying out all the method steps according to the invention and as is described above if the computer program is executed by a processor.

Furthermore, one embodiment of the invention relates to a data medium on which the program code of the computer program according to the invention and as is described above that can be executed by the processor is stored.

Another embodiment of the invention relates to an apparatus for controlling an electromagnetic drive of a switching device, comprising a processor, in particular a microprocessor or microcontroller, and a memory in which a program is stored that configures the processor to execute a method according to the invention and as is described herein.

Another embodiment of the invention relates to a switching device, in particular a contactor, comprising a switching drive having a coil, and an apparatus according to the invention and as is described herein for controlling the power supply of the coil.

In the following description, like, functionally like and functionally associated elements may be provided with the same reference signs. Absolute values are given in the following only by way of example and should not be understood to have a limiting effect on the invention.

Figure 2:
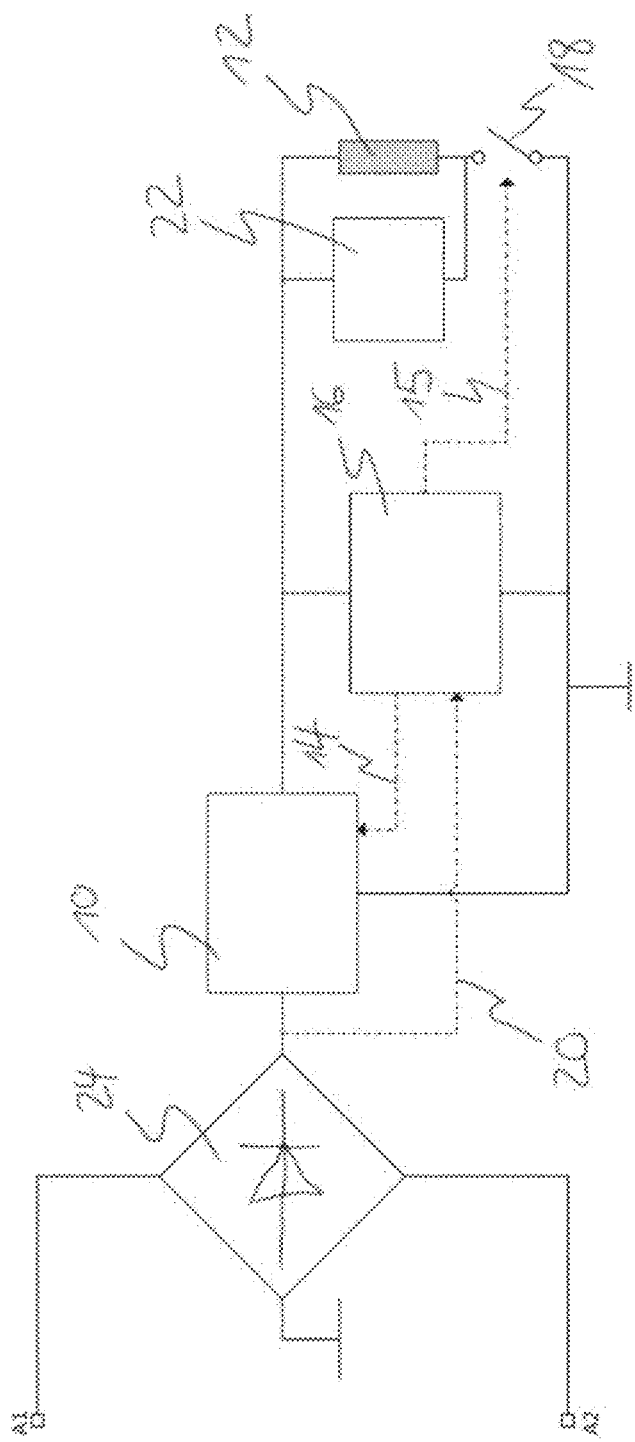
FIG. 2 is a block diagram of a first embodiment of a control apparatus for the electromagnetic drive of a switching device according to the present invention.

FIG. 2 is a block diagram of a control apparatus or control electronics according to the invention, which is/are in principle designed for a wide input voltage range and can be implemented relatively compactly on a printed circuit board. The control apparatus is, for example, suitable for being integrated into a switching device, such as a contactor, for example a multi-voltage contactor. A multi-voltage contactor or switching device is understood here to mean a contactor or switching device that is intended and designed for a plurality of different rated voltage ranges, for example for a voltage range of from approximately 24 volts to approximately 240 volts.

The control apparatus comprises a power supply unit 10, a control unit 16, for example implemented as a processor and a memory (in particular a microcontroller), a quick deenergizing unit 22 and a controllable switch 18. Strictly speaking, the rectifier 24 shown in FIG. 1 is not part of the control apparatus, but may still be provided on a printed circuit board of the control apparatus. All voltages and signals of the control apparatus are in relation to ground.

The rectifier 24 is supplied by an AC voltage applied at the terminals A1 and A2. The DC voltage generated from the AC voltage by the rectifier 24 supplies the power supply unit 10, which generates from said DC voltage an output voltage for powering the control unit 16 and a coil 12 of an electromagnetic drive of a switching device. The quick deenergizing unit 22 is parallel-connected to the coil 12. The controllable switch 18, for example a switching transistor having an appropriate current load capacity and being suitable for the occurring voltages, is connected between the coil 12 and ground.

Figure 3:
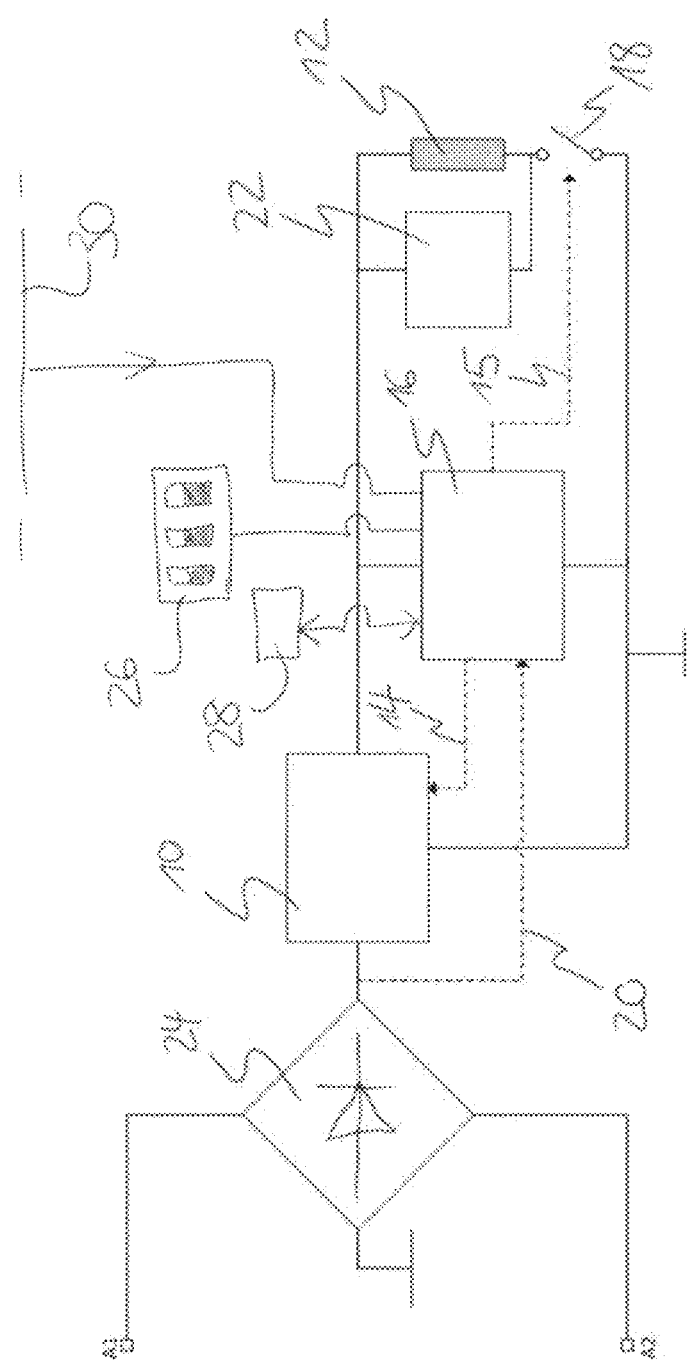
FIG. 3 is a block diagram of a second embodiment of a control apparatus for the electromagnetic drive of a switching device according to the present invention.

FIG. 3 is a block diagram of another control apparatus or further control electronics according to the invention, in which, in contrast with the control electronics shown in FIG. 2, a preset rated voltage range can be specified in various ways; for example, a DIP (dual in-line package) switch 26, by means of which various preset rated voltage ranges can be encoded, may be attached to the printed circuit board of the control electronics. There may also be a memory 28, for example on the printed circuit board or integrated into the control unit 16, in which memory a stored value may define a preset rated voltage range. As shown in FIG. 3, the memory 28 may be read out by the control unit 16 and written to, in particular a preset rated voltage range received from an external source being written thereto. Finally, in FIG. 3, a data bus 30 is shown as another source for a preset rated voltage range, to which data bus a data interface of the control electronics, in particular of the control unit 16, may be connected for data communication and by means of which the control electronics, in particular the control unit 16, can receive a value which specifies a preset rated voltage range.

The mode of operation of the control apparatus will now be described with reference to the flow chart, shown in FIG. 4, of a first embodiment of the method according to the invention, which method may be implemented, for example, by means of firmware of the control apparatus that is executed by the control unit 16, in particular by a microcontroller implementing the control unit.

First of all, in step S10 the supply voltage is connected to the contactor at the terminals A1 and A2 and rectified by the rectifier 24 (if the connected supply voltage is an AC voltage). The output voltage of the rectifier 24 is supplied to the power supply unit 10, which generates therefrom a supply voltage for the control unit 16, which thus launches the program stored in its memory.

When the program is launched, in step S12 the software to be executed by the processor of the control unit 16 is initialized, and all necessary program variables are declared; in particular, "UntereEinschaltspannung" and "Abschaltspannung" variables are declared for a lower switch-on voltage threshold and an upper switch-off voltage threshold, respectively, and are set to initial values of for example approximately 20 volts (UntereEinschaltspannung(1), e.g. 85% $U_{cmin}$) and approximately 12 volts (Abschaltspannung (1), e.g. 50% $U_{cmin}$), respectively.

Following step S12, in step S34 the control unit 16 measures the output voltage 20 of the rectifier 24 supplied at the input of said control unit and analyzes said measured voltage "$U_{mess}$" in step S14 by checking whether the measured voltage exceeds the lower switch-on voltage threshold "UntereEinschaltspannung(1)". If this is not the case, steps S34 and S14 are repeated until the threshold "UntereEinschaltspannung(1)" has been exceeded.

If the measured voltage exceeds the lower switch-on voltage threshold, in the subsequent step S16 the control unit 16 activates the electromagnetic drive of the switching device by signaling to the power supply unit 10, by means of a control signal 14, to generate a pull-in voltage for powering the coil 12 and to close the controllable switch 18 by means of a second control signal 15 such that current can flow through the coil 12.

After the drive has been activated in step S16, the control unit 16 proceeds to set the rated voltage range of the switching device on the basis of the control voltage of the switching device applied at the terminals A1 and A2, in the subsequent program steps S18 to S22 (S22 represents the (n)th voltage range).

For this purpose, it is first checked in step S18 whether the measured voltage "$U_{mess}$" lies in a first, in particular lower voltage range of from MinBereich(1) to MaxBereich(1), for example from approximately 24 volts to approximately 48 volts. If this is the case, in step S20 the "UntereEinschaltspannung" and "Abschaltspannung" variables for the lower switch-on voltage threshold and the upper switch-off voltage threshold, respectively, are adjusted to the first voltage range. However, if the measured voltage "$U_{mess}$" is greater than the first voltage range, a switch is made to the next, for example the next larger voltage range, and it is checked whether the measured voltage "$U_{mess}$" lies in said next larger voltage range n, and if the measured voltage lies in said larger voltage range, the lower switch-on voltage threshold and the upper switch-off voltage threshold are adjusted accordingly in step S24. It is thus checked in which of the specified voltage ranges of the contactor the measured voltage "$U_{mess}$" lies, and the rated voltage range of contactor is set to the corresponding specified voltage range, in particular in consideration of any requirements in the standards. In the flow diagram, this sequence of steps for determining and setting a suitable rated voltage range of the contactor on the basis of the measured voltage is shown by steps S18 and S24.

According to the number of specified voltage ranges, steps S18, S20 or S22, 24 are thus provided. For example, if three voltage ranges of from approximately 24 volts to approximately 48 volts, from approximately 48 volts to approximately 110 volts, and from approximately 110 volts to approximately 240 volts are specified, three sequences of steps S18, S20 or S22, S24 would be provided in the flow diagram in order to establish which of the three voltage ranges, which ideally do not overlap in the given example, would be suitable. If no rated voltage range can be determined, an error routine branches off via step 32, in which routine, for example, a specified standard rated voltage range may be set, an error message may be displayed, and/or the contactor may be switched off as a safety measure.

After the above-described sequence of steps is complete, in step S26 the electromagnetic drive of the contactor is switched to a standby mode if the appropriate conditions for this have been met. The switch to the standby mode takes place by means of the control unit 16, which sets the control signal 14 such that the power supply unit 10 generates, as a standby voltage for powering the coil 12, a voltage that is suitable and intended for the standby mode.

Following the switch to the standby mode of the contactor, in step S28 the control unit 16 continuously checks whether the measured voltage "$U_{mess}$" has fallen below the upper switch-off voltage threshold of the rated voltage range set in steps S18-S24. As soon as the voltage falls below the upper switch-off voltage threshold, in step S30 the control unit 16 switches the switching drive off by generating and emitting the second control signal 15 such that the controllable switch 18 is opened. After the switch 18 has been opened, the quick deenergizing unit 22 is automatically active, by means of which unit the energy stored in the coil 12 is discharged.

A slightly different mode of operation of the control apparatus will now be described on the basis of the flow chart, shown in FIG. 5, of a second embodiment of the method according to the invention. In the flow chart, the same reference signs will be used for steps that are similar or identical to steps from the flow chart in FIG. 4.

Figure 4:
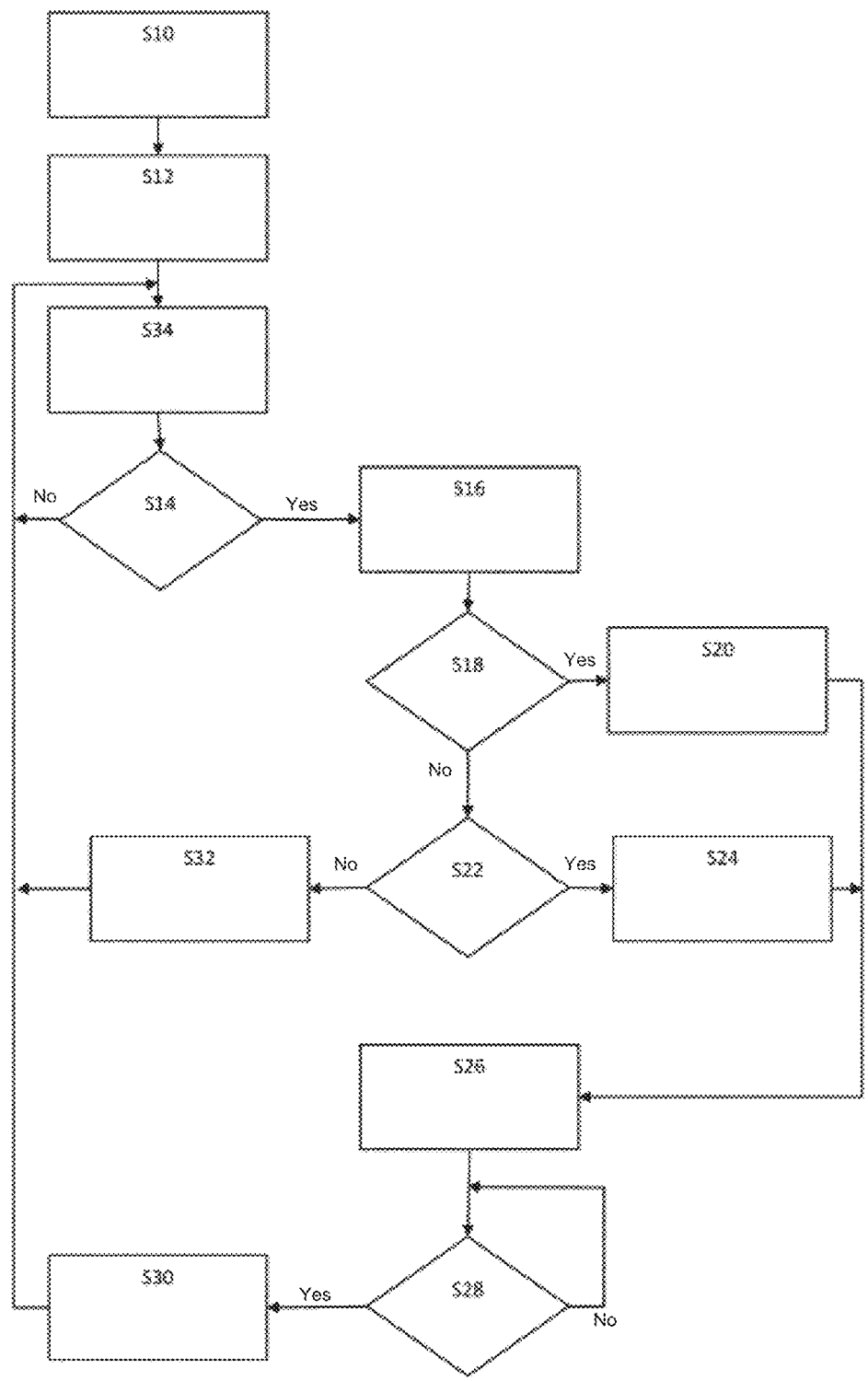
FIG. 4 is a flow chart of a first embodiment of a control method for an electromagnetic drive of a switching device according to the present invention.
Figure 5:
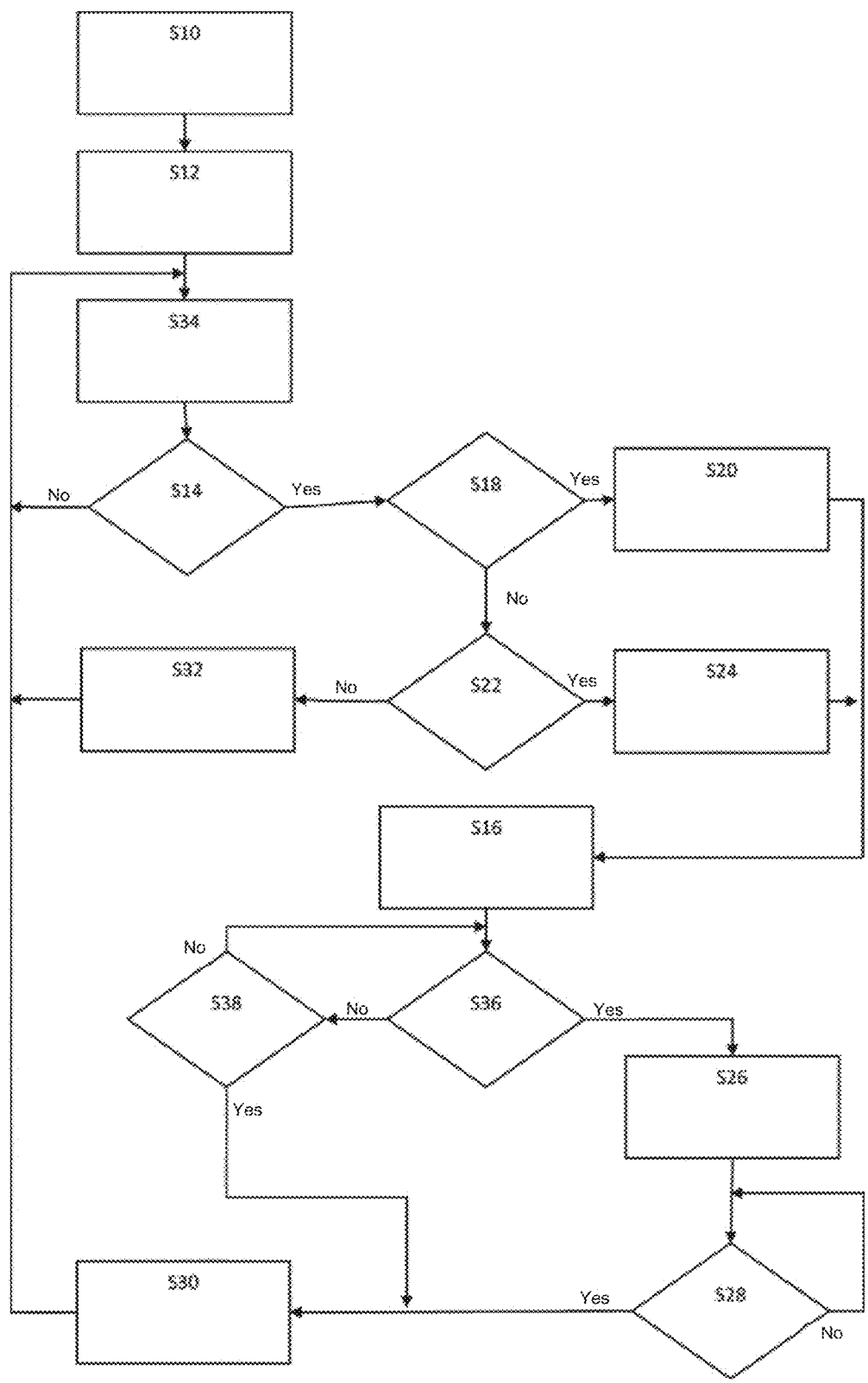
FIG. 5 is a flow chart of a second embodiment of a control method for an electromagnetic drive of a switching device according to the present invention.

The flow chart shown in FIG. 5 differs from the flow chart shown in FIG. 4 in particular in that, first of all, a suitable rated voltage range of the contactor is determined, and only after this is the contactor drive activated.

Steps S10, S12, S34 and S14 and the sequence thereof correspond to the steps and the corresponding sequence in the flow chart in FIG. 4.

As soon as $U_{mess}$ has exceeded the threshold "UntereEinschaltspannung(1)" in S14, the rated voltage range relevant to the measured input voltage is determined in the subsequent program steps S18 to S22 (S22 represents the (n)th voltage range), as in the flow chart in FIG. 4.

After a rated voltage range has been successfully assigned, in the subsequent step S16 the control unit 16 activates the electromagnetic drive of the switching device by signaling to the power supply unit 10, by means of a control signal 14, to generate a pull-in voltage for powering the coil 12, and closing the controllable switch 18 by means of a second control signal 15 such that current can flow through the coil 12.

After the drive has been activated, in step 36 it is checked whether the pull-in process can be completed. At the same time, in step S38 the switch-off condition for the contactor is monitored, specifically to check whether the measured voltage "$U_{mess}$" falls below the upper switch-off voltage threshold of the rated voltage range set in S24. After the above-described sequence of steps has been completed, in step S26 the electromagnetic drive of the contactor is switched to a standby mode. The switch to the standby mode takes place by means of the control unit 16, which sets the control signal 14 such that the power supply unit 10 generates, as a standby voltage for powering the coil 12, a voltage that is suitable and intended for the standby mode.

Following the switch to the standby mode of the contactor, in step S28 the control unit 16 continuously checks whether the measured voltage "$U_{mess}$" has fallen below the upper switch-off voltage threshold of the rated voltage range set in steps S18-S24. As soon as the voltage falls below the upper switch-off voltage threshold, the control unit 16 switches the switching drive off by generating and emitting the second control signal 15 such that the controllable switch 18 is opened. After the switch 18 has been opened, the quick deenergizing unit 22 is automatically active, by means of which unit the energy stored in the coil 12 is discharged.

Figure 6:
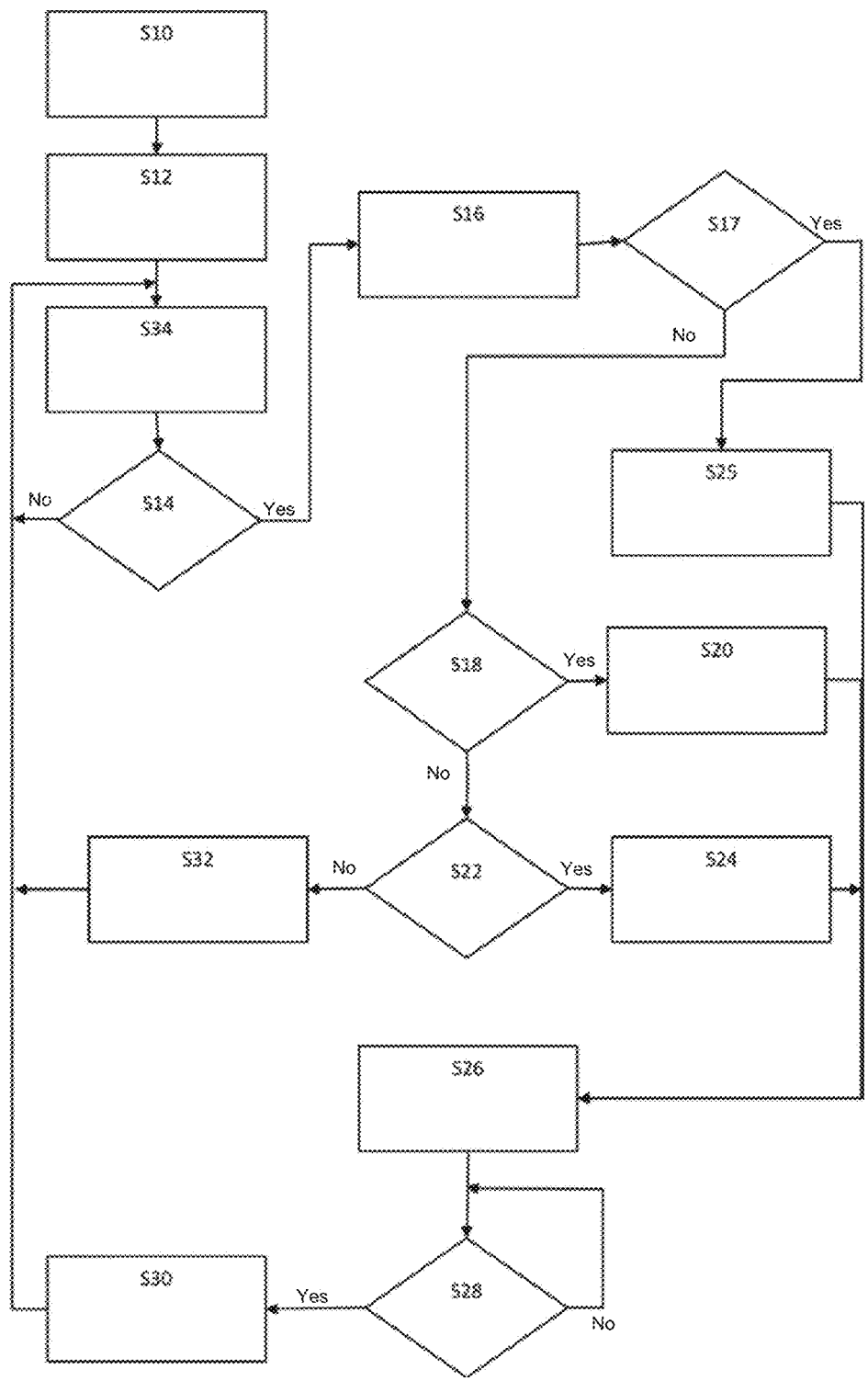
FIG. 6 is a flow chart of a third embodiment of a control method for an electromagnetic drive of a switching device according to the present invention.

Finally, FIG. 6 is a flow chart showing a mode of operation of the control apparatus in consideration of a preset rated voltage range, which may originate, as in the case of the circuit shown in FIG. 3, from various sources, such as a DIP switch 26, a memory 28 or an external source that is connected to the circuit by means of a data bus 30. The flow chart in FIG. 6 differs from the flow chart in FIG. 4 in the setting of the rated voltage range. After the drive has been activated in step S16, in step S17 the control unit 16 first checks whether a rated voltage range is preset, i.e. whether, as in the case of the circuit shown in FIG. 3, for example, a preset rated voltage range is encoded by the DIP switch 26, whether a stored value that defines a preset rated voltage range is stored in the memory 28, and/or whether a value (which was stored in the memory 28 or an intermediate memory of the control unit 16, for example) is or has been received by means of the data bus 30. If the check in step S17 shows that a preset rated voltage range is available, in step S25 the rated voltage range is set to the preset rated voltage range by the control unit 16. However, if the check in step S17 shows that a preset rated voltage range is not available, the control unit proceeds to set the rated voltage range as above with reference to the flow chart shown in FIG. 4. Step S17 may also be implemented such that not only the presence of preset rated voltage range, for example as a value encoded by a switch or as a stored value, is a criterion for setting the rated voltage range to a preset rated voltage range, but also how stable the supply voltage is at the terminals A1 and A2. The stability may be determined in particular on the basis of specified threshold values, such as minimum and maximum voltage values; if the supply voltage at the terminals A1 and A1 exceeds and/or falls below said threshold values, it can be concluded that the supply voltage at the terminals A1 and A2 is unstable and it can be determined in step S17 that the preset rated voltage range is used instead of a rated voltage range determined automatically on the basis of the supply voltage at the terminals A1 and A2.

This makes it possible to further increase the operational safety of a switching apparatus according to the invention, in particular in an operational environment having a supply voltage at the terminals A1 and A2 which significantly fluctuates or drops sharply.

The significant advantage of the present invention is that it is possible to implement a multi-voltage switching device that is suitable for a large input voltage range. This leads to further advantages, as follows: the coil types of the electromagnetic drive can be reduced since a separate coil no longer has to be used for each input voltage range, but rather one coil can be used for a plurality of different input voltages; the number of components can be reduced; a universally applicable "plug-and-play" switching device is provided that can be used in many installations, without restrictions on account of a particular control voltage.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for controlling an electromagnetic drive of a switching device by means of a program, wherein a processor configured by the program executes the following steps:
   measuring a control voltage applied at an input of the switching device;
   activating the electromagnetic drive on the basis of the measured control voltage; and
   setting a rated voltage range on the basis of the measured control voltage,
   wherein setting the rated voltage range on the basis of the measured control voltage comprises calculating a lower switch-on voltage threshold and an upper switch-off voltage threshold on the basis of the measured control voltage.

2. The method according to claim 1, further comprising the following steps:
- initializing the program and declaring a program variable for a lower switch-on voltage threshold;
- checking whether the measured control voltage exceeds the lower switch-on voltage threshold; and
- activating the electromagnetic drive on the basis of the check.

3. The method according to claim 1, wherein setting the rated voltage range on the basis of the measured control voltage comprises the following steps:
- determining in which of the specified voltage ranges the measured voltage control voltage lies; and
- adjusting a lower switch-on voltage threshold and an upper switch-off voltage threshold on the basis of the determined specified voltage range.

4. The method according to claim 3, wherein determining in which of the specified voltage ranges the measured control voltage lies comprises a plurality of steps to be executed, each of which is configured for one of the specified voltage ranges,
- wherein adjusting the lower switch-on voltage threshold and an upper switch-off voltage threshold on the basis of the determined specified voltage range is carried out following each of the steps to be executed, and
- wherein the specified voltage ranges are shifted to higher voltage ranges upon each executed step.

5. The method according to claim 3, wherein the specified voltage ranges do not overlap.

6. The method according to claim 3, wherein the specified voltage ranges have a first specified AC or DC voltage range of from approximately 24 volts to approximately 48 volts, a second specified AC or DC voltage range of from approximately 48 volts to approximately 110 volts, and a third specified AC or DC voltage range of from approximately 110 volts to approximately 240 volts.

7. The method according to claim 1, wherein setting the rated voltage range further comprises the following steps:
- checking whether a rated voltage range is preset, and
- setting the rated voltage range to the preset rated voltage range.

8. The method according to claim 7, wherein the rated voltage range is set to the preset rated voltage range if a preset rated voltage range is available, or if a preset rated voltage range is available and the measured control voltage exceeds and/or falls below one or more specified threshold values.

9. The method according to claim 7, wherein a preset rated voltage range is defined by a switch, a stored value, and/or a value received through data communication.

10. A computer program comprising program code for carrying out the method according to claim 1 if the computer program is executed by the processor.

11. A data medium, on which the program code of the computer program according to claim 10, which can be executed by the processor, is stored.

12. An apparatus for controlling the electromagnetic drive of the switching device, comprising the processor and a memory in which the program is stored that configures the processor to execute the method according to claim 1.

13. A switching device, comprising:
- a switching drive having a coil; and
- the apparatus according to claim 12 configured to control a power supply of the coil.

14. The method according to claim 9, wherein the switch comprises a DIP switch.

15. The switching device according to claim 13, wherein the switching device comprises a contactor.

16. A method for controlling an electromagnetic drive of a switching device by means of a program, wherein a processor configured by the program executes the following steps:
- measuring a control voltage applied at an input of the switching device;
- activating the electromagnetic drive on the basis of the measured control voltage;
- setting a rated voltage range on the basis of the measured control voltage;
- initializing the program and declaring a program variable for a lower switch-on voltage threshold;
- checking whether the measured control voltage exceeds the lower switch-on voltage threshold; and
- activating the electromagnetic drive on the basis of the check.

17. A method for controlling an electromagnetic drive of a switching device by means of a program, wherein a processor configured by the program executes the following steps:
- measuring a control voltage applied at an input of the switching device;
- activating the electromagnetic drive on the basis of the measured control voltage; and
- setting a rated voltage range on the basis of the measured control voltage,
- wherein setting the rated voltage range on the basis of the measured control voltage comprises the following steps:
  - determining in which of the specified voltage ranges the measured voltage control voltage lies; and
  - adjusting a lower switch-on voltage threshold and an upper switch-off voltage threshold on the basis of the determined specified voltage range.

* * * * *